United States Patent
Ryan et al.

(10) Patent No.: US 11,075,370 B2
(45) Date of Patent: Jul. 27, 2021

(54) METHOD OF FABRICATING AN ELECTRODE STRUCTURE HAVING A CONTINUOUS POROUS NETWORK NANOSTRUCTURE BY ELECTROCHEMICAL CYCLING

(71) Applicant: University of Limerick, Limerick (IE)

(72) Inventors: Kevin M. Ryan, County Limerick (IE); Tadhg Kennedy, C. Tipperary (IE); Emma Mullane, Limerick (IE)

(73) Assignee: UNIVERSITY OF LIMERICK

( * ) Notice: Subject to any disclaimer, the term of this patent is extended or adjusted under 35 U.S.C. 154(b) by 25 days.

(21) Appl. No.: 15/703,493

(22) Filed: Sep. 13, 2017

(65) Prior Publication Data

US 2018/0006295 A1    Jan. 4, 2018

Related U.S. Application Data

(62) Division of application No. 14/594,548, filed on Jan. 12, 2015, now abandoned.

(30) Foreign Application Priority Data

Apr. 3, 2014    (EP) ..................... 14163334

(51) Int. Cl.
| | |
|---|---|
| *H01M 4/1395* | (2010.01) |
| *H01M 4/134* | (2010.01) |
| *C30B 29/06* | (2006.01) |
| *H01M 4/04* | (2006.01) |
| *H01M 4/38* | (2006.01) |

(Continued)

(52) U.S. Cl.
CPC ......... *H01M 4/134* (2013.01); *C23C 16/0227* (2013.01); *C23C 16/0281* (2013.01); *C23C 16/24* (2013.01); *C23C 16/28* (2013.01); *C23C 16/4408* (2013.01); *C23C 16/52* (2013.01); *C23C 16/56* (2013.01); *C30B 29/06* (2013.01); *H01M 4/045* (2013.01); *H01M 4/0428* (2013.01); *H01M 4/0445* (2013.01); *H01M 4/1395* (2013.01); *H01M 4/38* (2013.01); *H01M 4/386* (2013.01); *H01M 4/387* (2013.01); *H01M 4/662* (2013.01); *H01M 50/46* (2021.01); *B82Y 40/00* (2013.01); *H01M 10/052* (2013.01); *H01M 2004/027* (2013.01)

(58) Field of Classification Search
None
See application file for complete search history.

(56) References Cited

U.S. PATENT DOCUMENTS

| 9,112,212 B1 | 8/2015 | Fasching et al. |
| 2011/0223484 A1 | 9/2011 | Korgel et al. |

(Continued)

OTHER PUBLICATIONS

Liu et al., Reversible Nanopore Formation in Ge Nanowires during Lithiation-Delithiation Cycling: An In Situ Transmission Electron Microscopy Study, Nano let. 2011, 11, 3991-3997 (Year: 2011).*

(Continued)

*Primary Examiner* — Lucas J. O'Donnell
(74) *Attorney, Agent, or Firm* — K&L Gates LLP (57) ABSTRACT

The invention provides process for producing a stable Si or Ge electrode structure comprising cycling a Si or Ge nanowire electrode until a structure of the Si nanowires form a continuous porous network of Si or Ge ligaments.

5 Claims, 7 Drawing Sheets

(51) Int. Cl.
  *H01M 4/66*    (2006.01)
  *H01M 50/46*   (2021.01)
  *C23C 16/02*   (2006.01)
  *C23C 16/24*   (2006.01)
  *C23C 16/28*   (2006.01)
  *C23C 16/44*   (2006.01)
  *C23C 16/52*   (2006.01)
  *C23C 16/56*   (2006.01)
  *H01M 10/052*  (2010.01)
  *B82Y 40/00*   (2011.01)
  *H01M 4/02*    (2006.01)

(56) References Cited

U.S. PATENT DOCUMENTS

2012/0088155 A1   4/2012   Yushin et al.
2012/0313587 A1  12/2012   Norton et al.
2013/0295461 A1  11/2013   Chen et al.
2015/0188125 A1   7/2015   Korgel et al.

OTHER PUBLICATIONS

Chan et al., "Facile pyrolytic synthesis of silicon nanowires," Available online Jun. 11, 2010, Solid-State Electronics 54 (2010) 1185-1191.

Kennedy, et al. "High-Performance Germanium Nanowire-Based Lithium-Ion Battery Anodes Extending over 1000-Cycles Through in Situ Formation of a Continuous Porous Network" Nano Letters (2014), vol. 14, No. 2, pp. 716-723.

Mullane, et al. "Synthesis of Tin Catalyzed Silicon and Germanium Nanowires in a Solvent-Vapor System and Optimization of the Seed/Nanowire Interface for Dual Lithium Cycling" Chemistry of Materials (2013), vol. 25, No. 9, pp. 1816-1822.

Search Report from related European Patent Application No. EP14163334 dated May 20, 2014.

Kennedy et al., "Understanding the influence of electrolyte additives on the electrochemical performance and orphology evolution of silicon nanowire based lithium-ion battery anodes", Journal of Power Sources 359 (2017) pp. 601-610.

Lee, S. W. et al., "Fracture of crystalline silicon nanopillars during electrochemical lithium insertion", PNAS, 2012, 109 (11), 4080-4085.

Li, W. et al., "Si-, Ge-, Sn-based anode materials for lithium-ion batteries: from structure design to electrochemical performance", Small Methods 2017, 1 (3), 1600037; 22 pages.

Ryu, I. et al., "Size-dependent fracture of Si nanowire battery anodes", J. Mech. Phys. Solids 2011, 59 (9), 1717-1730.

* cited by examiner

|  | Initial Charge Capacity (mAh/g) | Initial Discharge Capacity (mAh/g) | Capacity retention after 100 cycles (%) | Capacity retention after 250 cycles (%) | CE at 100th Cycle (%) |
|---|---|---|---|---|---|
| VC Free Electrolyte | 2688 | 1139 | 42.4 | 57.8 | 95.7 |
| VC Containing Electrolyte | 2343 | 1106 | 47.2 | 85.8 | 99.0 |

Figure 7

METHOD OF FABRICATING AN ELECTRODE STRUCTURE HAVING A CONTINUOUS POROUS NETWORK NANOSTRUCTURE BY ELECTROCHEMICAL CYCLING

CROSS REFERENCE TO RELATED APPLICATIONS

This application is a divisional of U.S. patent application Ser. No. 14/594,548, filed Jan. 12, 2015, which claims priority to and the benefit of European Patent Application No. 14163334.7, filed on Apr. 3, 2014, the entire disclosures of each of which is incorporated by reference herein.

FIELD OF THE INVENTION

The present invention is concerned with anodes for use in batteries, in particular lithium-ion batteries, and a method to produce such an anode.

BACKGROUND TO THE INVENTION

Lithium-ion batteries have been conventionally fabricated using graphitic based anodes. However, recently there has been a desire to find an alternative material suitable for use as an anode in a lithium-ion battery due to the relatively low capacity of carbon. Alternative materials which have been investigated are the Group IV Li-alloying materials Silicon (Si), Germanium (Ge) and Tin (Sn), due to their high capacity (3579 1384 and 994 mAh/g respectively). However one problem associated with the use of these materials in a lithium-ion battery is the fact that they undergo a volume expansion and contraction during the charge and discharge processes. In fact, it has been found that Li-alloying materials can undergo a large volume change of up to 370% during the lithiation/delithiation process, This can lead to poor cycling performance, due to the pulverisation of the active material and loss of electrical contact with the current collector. It will be appreciated that this creates large mechanical stresses within the electrode. This is particularly an issue when thin films and micrometre-sized particles are used as electrodes, and results in a short battery life time for such electrodes.

Many strategies have been employed in an attempt to overcome this problem. These include dispersing Si or Ge in active/inactive buffer matrices, sheathing with carbon, and the use of thin film Si or Ge anodes. This problem has also been addressed by reducing the dimensions of the Si or Ge active material down to the nanoscale.

The most common method used for fabricating nanostructured electrodes is to synthesise the nanostructured materials first and then use in conjunction with binders and conductive additives. In these arrangements, the active material is applied using conventional slurry based methods. This method is a multi-step process, and involves first mixing the active material with conducting carbon and a nonconducting polymeric binder (such as polyvinylidene fluoride) in an inorganic solvent (NMP). The resulting slurry is coated onto a current collector, pressed and then annealed for several hours. However, such preparation methods are not ideal, as the whole process is time consuming and the solvent used in the slurry formulation is expensive, toxic and generates flammable vapours. Another major disadvantage is that the binder and conductive additives are electrochemically inactive, yet still add mass to the electrode, thus limiting the achievable capacity.

A further problem encountered with nanostructured electrodes is the continuous growth of the passivating SEI layer. The formation of a stable, thin SEI layer in the initial cycles is essential, as it prevents continuous decomposition of the electrolyte during each charge process. However, if the SEI is not flexible and cohesive, then the continuous expansion and contraction of the nanowires during cycling can lead to cracking of the passivating layer. This re-exposes the active material, causing further decomposition of the electrolyte on the surface and thickening of the SEI layer with each cycle. This ultimately inhibits the performance of the material over extended cycles, as it increases the cell's internal impedance on the surface of the active material due to the decomposition of the electrolyte.

It is an object of the present invention to provide an alternative material suitable for use as an anode in a lithium-ion battery which overcomes the above mentioned problems, and a process for fabricating same.

SUMMARY OF THE INVENTION

The present invention provides a process, as set out in the appended claims, for producing a stable Ge electrode structure comprising:
cycling a Ge nanostructure or nanowire electrode until the structure of the Ge forms a substantially continuous porous network of Ge ligaments.

The present invention also provides a process for producing a Si electrode structure comprising:
cycling a Si nanostructure or nanowire electrode until the structure of the Si forms a continuous porous network of Si ligaments.

The present invention also provides a process for producing a Sn electrode structure comprising:
cycling a Sn nanostructure or nanowire electrode until the structure of the Sn forms a continuous porous network of Si ligaments.

It will be appreciated that the term nanostructure should be interpreted broadly to include nanowires, nanotubes, nanoparticles and the like. In one embodiment the process further comprises continually lithiating and delithiating the Si or Ge or Sn nanowire electrode to form the continuous porous network of Si or Ge or Sn ligaments.

The present invention provides a Ge anode for a lithium-ion battery wherein the electrolyte comprises a stable SEI former.

The present invention also provides a Si anode for a lithium-ion battery wherein the electrolyte comprises a stable SEI former.

Preferably the electrode is cycled for at least 100 cycles.
In one embodiment the electrode is cycled at a rate of C/2.
The present invention also provides an anode for a lithium-ion battery comprising a continuous porous network of a lithium-alloying active material.

In one embodiment the network comprises interwoven ligaments of the active material.

In one embodiment the average ligament diameter comprises 5 nm.

In one embodiment the lithium-alloying active material comprises one of Silicon, Germanium, or Tin.

The present invention also provides a lithium-ion battery comprising: the anode and
an electrolyte comprising a solid electrolyte interphase layer former.

In one embodiment the solid electrolyte interphase layer former comprises vinylene carbonate.

The present invention also provides an anode for a battery comprising an electrode produced using the process of the invention.

The present invention also provides a lithium ion battery comprising the anode of the invention.

The present invention also provides an anode for a lithium-ion battery comprising of tin seeded Ge nanowires.

The present invention also provides an anode for a lithium-ion battery comprising of tin seeded Si nanowires.

In one embodiment there is provided a process for producing a composite electrode structure comprising:
cycling a Si nanostructure/carbon composite electrode to form a continuous porous network of Si ligaments.

In one embodiment there is provided a process for producing a composite electrode structure comprising:
cycling a Ge nanostructure/carbon composite electrode to form a continuous porous network of Ge ligaments.

In one embodiment there is provided a process for producing a composite electrode structure comprising:
cycling a Ge/Si nanostructure composite electrode to form a continuous porous network of Ge/Si ligaments.

In one embodiment there is provided a method for producing tin seeded Silicon or Germanium nanowires grown by solution decomposition comprising:
evaporating tin onto the surface of stainless steel substrates;
placing the pre-treated stainless steel substrates in a chamber;
adding a high boiling point solvent to the chamber;
heating the chamber to a first temperature;
applying a vacuum to the chamber;
purging the chamber with an inert gas and increasing the temperature of the chamber to the reaction temperature; and
injecting a silicon or germanium precursor into the chamber; wherein the chemical vapour deposition of the silicon or germanium monomer from the decomposition of the injected silicon or germanium precursor produces tin seeded Silicon or Germanium nanowires via the vapour-liquid solid growth mechanism.

In one embodiment 99.99% purity tin is evaporated.

In one embodiment there is provided the step of rinsing and drying the stainless steel substrates prior to placing the substrates in the chamber.

In one embodiment the substrates are rinsed in toluene and dried by means of a nitrogen line.

In one embodiment the vacuum is applied to the chamber for one hour.

In one embodiment there is provided the step of providing a constant flow of inert gas to the chamber.

In one embodiment the first temperature is 125° C.

In one embodiment the high boiling point solvent comprises 7 mls of squalane.

In one embodiment the reaction temperature is 430° C.

In one embodiment the precursor is phenylsilane or diphenylgermane.

In one embodiment there is provided the step of washing the tin seeded Silicon or Germanium nanowires.

In one embodiment there is provided a Si or Ge anode for a lithium-ion battery wherein the electrolyte comprises a stable SEI former.

In one embodiment there is provided an anode for a battery comprising an electrode produced using the process or method as hereinbefore described with reference to the description and accompanying figures.

In one embodiment there is provided an anode for a lithium-ion battery comprising a tin seeded Ge nanowire.

In one embodiment there is provided an anode for a lithium-ion battery comprising a tin seeded Si nanowire.

In one embodiment there is also provided a method for producing tin seeded Silicon nanowires grown by solution decomposition comprising:
evaporating tin onto the surface of stainless steel substrates;
placing the pre-treated stainless steel substrates in a chamber;
adding a high boiling point solvent to the chamber;
heating the chamber to a first temperature;
applying a vacuum to the chamber;
purging the chamber with an inert gas and increasing the temperature of the chamber to the reaction temperature; and
injecting a Silicon precursor into the chamber; wherein the chemical vapour deposition of the Silicon monomer from the decomposition of the injected Silicon precursor produces tin seeded silicon nanowires via the vapour-liquid solid growth mechanism.

BRIEF DESCRIPTION OF THE DRAWINGS

The invention will be more clearly understood from the following description of an embodiment thereof, given by way of example only, with reference to the accompanying drawings, in which: —

DETAILED DESCRIPTION OF THE DRAWINGS

The present invention will now be described with the aid of the accompanying drawings. In essence, the present invention discloses a method for producing tin (Sn) seeded Silicon or Germanium nanowires directly from a stainless steel current collector through a solvent vapour growth (SVG) system. The resulting synthesized Si or Ge nanowires are then suitable for use as an anode in a Li-ion battery. The invention also discloses an active material comprising ananostructured porous network of Li-alloying materials for use as an anode in a Li-ion battery, as well as a process for forming such an active material from an Sn seeded Si or Ge nanowire electrode.

Figure 1:
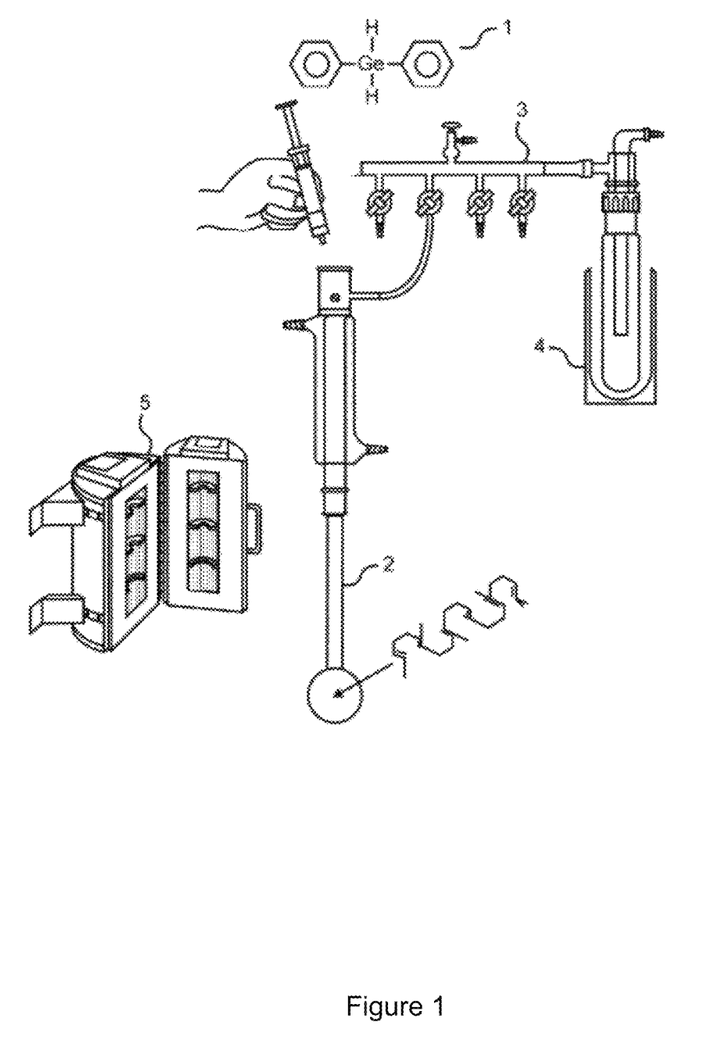
FIG. 1 is a block diagram of the main components of a system for carrying out the synthesis of Si or Ge nanowires.

FIG. 1 shows a block diagram of the main components of a system for carrying out the method of the present invention to produce Sn seeded Si or Ge nanowires 1. It comprises a chamber 2 to which is coupled an inert gas supply line 3 attached to a water condenser 4. A heating apparatus 5 is also provided to heat the chamber to the required temperatures.

Figure 2:
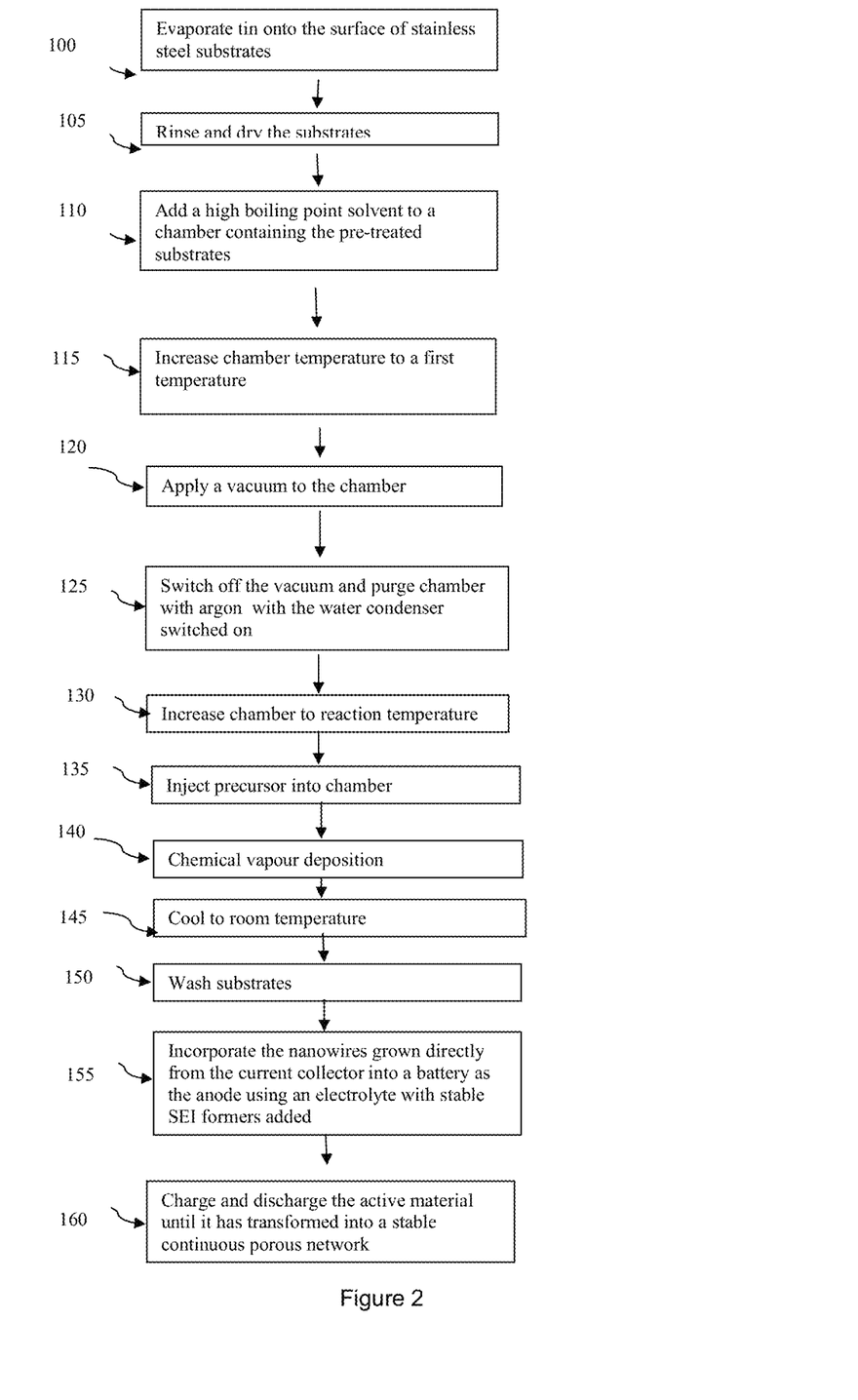
FIG. 2 is a flow chart illustrating operation of the invention according to one aspect of the invention.

FIG. 2 shows the main steps involved in the fabrication process of the Sn seeded Si or Ge nanowires. In step 100, pre-treated stainless steel substrates are produced by evaporating Sn onto the surface of stainless steel substrates in a glovebox based evaporation unit. In the preferred embodiment of the invention, 99.99% Sn is evaporated, with the Sn having a thicknesses of 20 nm. However any thickness of Sn above 1 nm could be used. The substrates are stored in an Argon glovebox prior to the reaction, so that contact with oxygen is minimized. Once the substrates are synthesized, the substrates are optionally washed to remove any impurities on their surface and dried (step 105). The washing may be performed with toluene, while the drying may be performed using a nitrogen line. However, any solvent which will not react with either the tin catalyst or the stainless steel substrate can be used for washing, such as for example acetone, acetonitrile and methanol.

The grown pre-treated stainless steel substrates are then placed vertically in a chamber. In the preferred embodiment, this chamber is a round bottomed Pyrex flask which is attached to a schlenk line setup to provide a vacuum to the chamber via a water condenser. In step 110, a high boiling point solvent is added to the chamber. The high boiling point solvent is then heated to its reaction temperature in the chamber by a heating apparatus (step 115). By holding the solvent under vacuum and increasing the temperature of the chamber, the solvent is de-gassed and any impurities are removed from it. In the preferred embodiment of the process, 7 mls of the solvent squalane (Aldrich 99%) is added, and the temperature of the chamber is increased to 125° C. through the use of a three zone furnace. However, any other high boiling point solvent could also be used, such as for example olelylalchol, olelylamine and/or dotriacontaine. A vacuum is then applied to the chamber in order to remove any moisture (step 120). A vacuum of at least 100 mTorr is applied for 1 hour in the preferred embodiment of the invention. The vacuum is then switched off, and the system is purged with argon (Ar) gas while the condenser is switched on (step 125). By purging the system with argon gas, an inert environment is provided in which the reaction can take place. The temperature of the chamber is then increased to the reaction temperature of 430° C. under a constant flow of argon gas in order to achieve a reflux (step 130). It should be noted that this temperature is above decomposition temperature of the precursor which is to be injected. In step 135, once the system has reached the correct reaction temperature, a precursor is injected into the chamber. In the preferred embodiment of the invention, the precursor is Diphenylsilane (97% Aldrich), for Si nanowires or Diphenylgermane (97% Gelest Inc.) for Ge nanowires which is injected through a septum cap into the chamber, and the reaction is held at 430° C. for 10 mins. However, any other suitable precursor could equally well be used, such as for example diphenylsilane, triphenylsilane, silane, trichlorosilane, tetraethylsilane, tetramethylsilane, trisilane, triphenlygermane, triphenylgermane/phenyl silane mixture, phenylgermane, trichlorogermane, tetraethylgermane, tetramethylgermane or trigermane.

A water condenser is used to control the solvent reflux and ensure that the reaction is kept under control. Subsequent chemical vapour deposition produces the Sn seeded Silicon or Germanium nanowires (step 140). This is due to the fact that at the reaction temperature the Sn catalyst forms discrete liquid islands, which act as seeds for nanowire growth, while the silicon or germanium precursor decomposes upon injection to form silane or germane gas, which provides the monomer for nanowire growth. Growth of the Sn seeded Si or Ge nanowires then occurs via the vapour-liquid-solid (VLS) mechanism which is well known to a person skilled in the art.

To terminate the reaction, the chamber is opened, and the setup is allowed to cool to room temperature (step 145). The resulting Sn seeded Si or Ge nanowires coated substrates can then be removed. The nanowires are washed, for example with toluene (step 150). The nanowires may then be used as the anode for lithium-ion battery applications without further modification.

The nanowires are incorporated as a battery anode asgrown (step 155) with an electrolyte containing a stable SEI former. The nanowires may then be charged and discharged repeatedly to transform them into a stable network of active material (step 160).

Figure 3A:
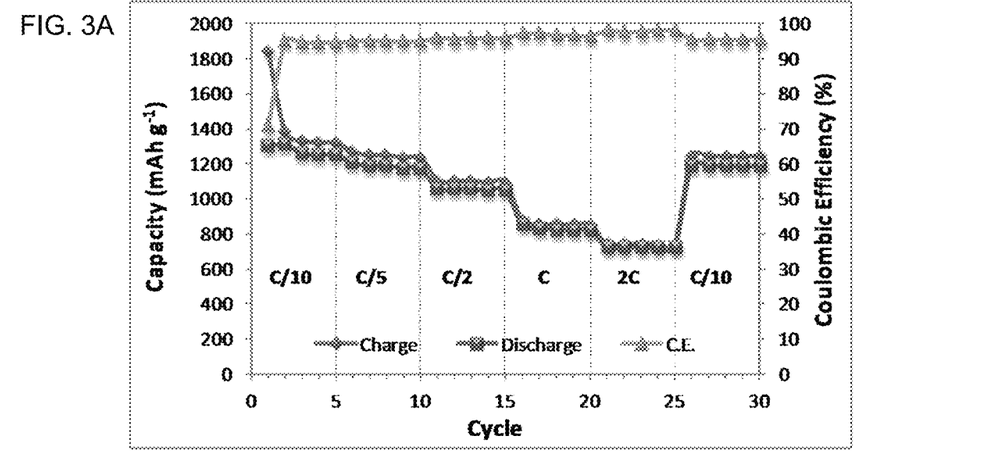
FIG. 3A, FIG. 3B, and FIG. 3C show graphs of the charge and discharge capacities of a continuous porous network of Ge electrode formed through cycling of the Sn seeded Germanium nanowires of the present invention at various charge and discharge rates.
Figure 3B:
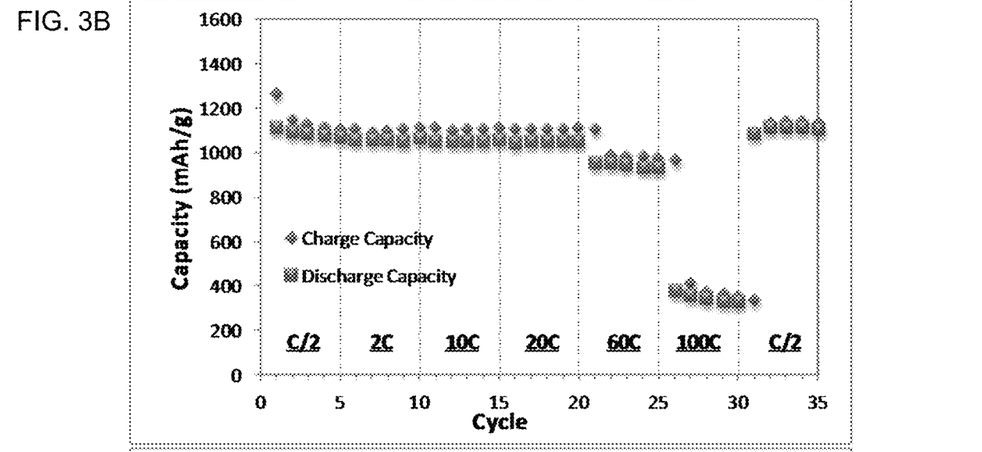

FIG. 3A illustrates the rate capability of the fabricated continuous porous network of Ge electrode of the present invention when used as an anode in a lithium-ion battery when the material is charged and discharged for 5 cycles at rates of C/10, C/5, C/2, C, 2C and then back to C/10. It can be seen from this figure that the electrode exhibits discharge capacities at each rate of 1250, 1174, 1050, 821, 722 and 1188 mAh/g respectively. Even at the high rate of 2 C, the electrode performs very well, with the capacity being almost twice the maximum theoretical capacity of graphite. FIG. 3B shows the discharge capacities measured at 5 cycles at 6 different discharge rates while charging at a fixed rate of C/2. It can be seen that the nanowires show very little capacity fade up to discharge rates of 20 C. At 20 C, a capacity of 1053 mAh/g is maintained over 5 cycles, which is 95% of the initial discharge capacity at the slower C/2 rate. At discharge rates of 60 C and 100 C, the electrode exhibits discharge capacities of 930 mAh/g and 354 mAh/g respectively. Furthermore, it can be seen that the electrode recovers 100% of its capacity when the current reverted to the initial C/2 rate.

Figure 3C:
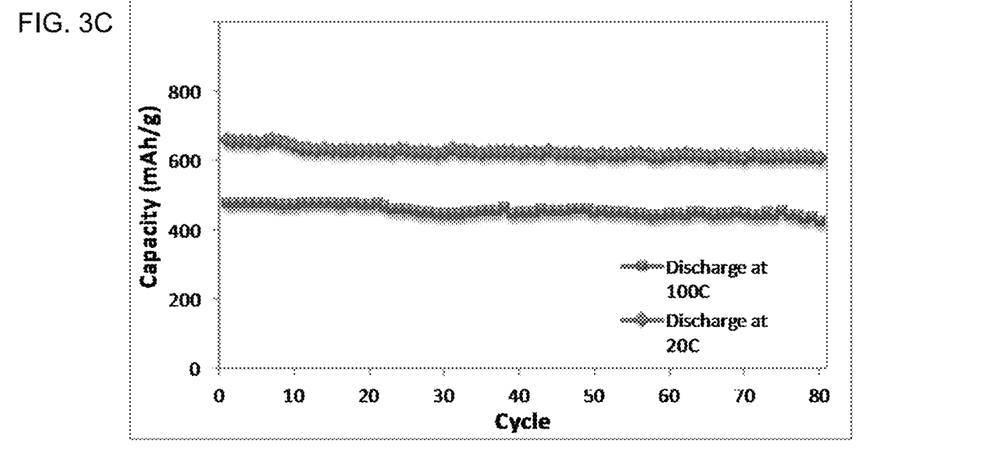

FIG. 3C shows the capacity data where two different Ge nanowire electrodes are charged at a 2 C rate and discharged at either 20 C or 100 C. After 80 cycles, the 20 C rate electrode displayed a discharge capacity of 610 mAh/g, corresponding to a 92.6% capacity retention from the $1^{st}$ cycle. It will be appreciated that even at the very high rate of 100 C, the nanowire electrode outperforms the maximum achievable capacity of traditional graphite based electrodes at more modest rates (372 mAh/g). The electrode exhibits an initial discharge capacity of 480 mAh/g, retaining a capacity of 425 mAh/g after 80 cycles.

It has been found that obtaining a stable performance from nanowire electrodes can be difficult over extended cycles, as the active material has a tendency to lose contact with the current collector, due to the extreme volume changes occurring due to cycling. Thus, the present invention also discloses a porous, interconnected network of Li-alloying active material (Si, Ge or Sn) for use as a lithium-ion battery anode which can accommodate the volume change without deformation of its morphology and without losing contact with the current collector. This results in a very long cycle life for the electrode. In the preferred embodiment of the invention, the active material has average radial dimensions of approximately 5 nm.

Figure 4A:
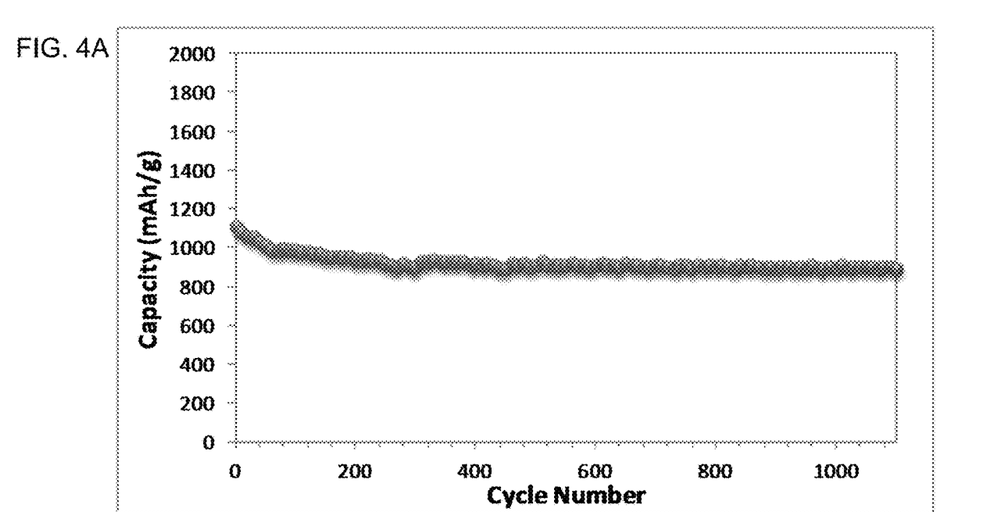
FIG. 4A shows a graph of the long term cycling data of the continuous porous network of Ge electrode of the present invention cycled at a C/2 rate.
Figure 4B:
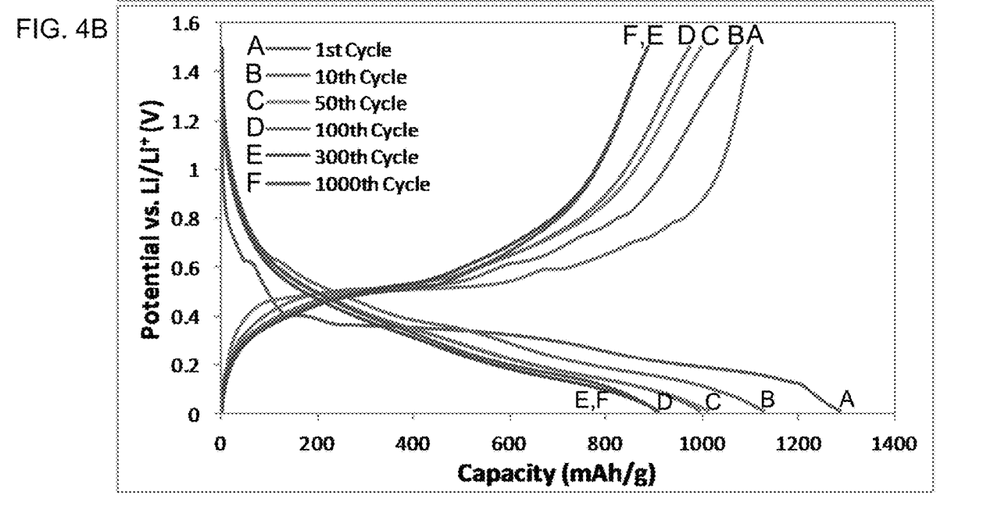
FIG. 4B shows the voltage profiles of the $1^{st}$, $2^{nd}$ $50^{th}$, $100^{th}$, $300^{th}$ and $1000^{th}$ cycle of the long term cycling experiment in FIG. 3A.

In accordance with the present invention, a porous structure of interwoven ligaments of Si or Ge can be achieved by cycling a Si or Ge nanowires lithium-ion electrode for over a hundred cycles. In the preferred embodiment of the invention, the cycling is performed at a C/2 rate. This forms an active material comprising a continuous porous network of ligaments of the active material. This material provides an extremely stable structure, capable of withstanding the volume change without pulverisation and without loss of contact from the current collector when the Si or Ge nanowires are being used as a lithium-ion battery anode. This can be clearly seen from an analysis of FIGS. 4A and 4B, which illustrate the discharge capacity of such an electrode over 1100 cycles, and the voltage profiles of the $1^{st}$, $10^{th}$, $50^{th}$, $100^{th}$, $300^{th}$ and $1000^{th}$ cycles. It can be seen that the nanowires exhibit an initial discharge capacity of 1103 mAh/g and an average C.E. of 97.0%. It will be appreciated that overall the electrode performs extremely well, as it achieves a reversible capacity of 888 mAh/g after 1100 cycles, corresponding to a capacity retention of 80.5% from the first cycle. Analysis of the data shows that the bulk of the fade occurs in the first 100 cycles. The stability of the capacity is notable, considering the uncomplicated, binder free nature of the electrode. It should also be noted that the electrode displays a relatively constant capacity over a wide range of cycles, highlighted by the fact that the voltage profiles of the $300^{th}$ cycle and the $1000^{th}$ cycle are almost indistinguishable.

In one embodiment of the invention, the nanostructured porous network of Li-alloying active material is formed by continually lithiating and delithiating either Si, Ge or Sn. However, it will be appreciated that any other suitable method could equally well be used to form the same network structure. After 1 cycle, pores form throughout the active material, as extraction of Li during dealloying produces vacancies that aggregate into pores. With further cycling, the surface becomes progressively more textured, due to the coalescence of small pores to form larger pores. This has the effect of lowering the interfacial surface area between the active material and the electrolyte, thereby reducing the surface energy of the system. After 100 cycles, the original morphology of the active material is lost, having being replaced by a network of interweaving ligaments.

Figure 5A:
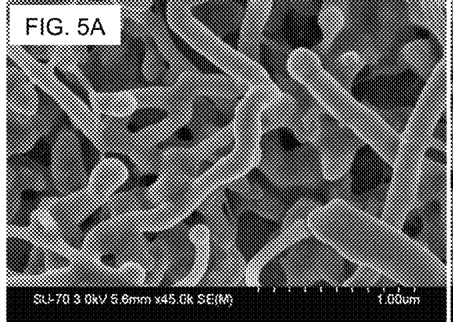
FIGS. 5A, 5B, 5C, 5D, 5E, and 5F show images of the restructuring of the nanowires into the stable continuous porous network of ligaments through cycling.
Figure 5B:
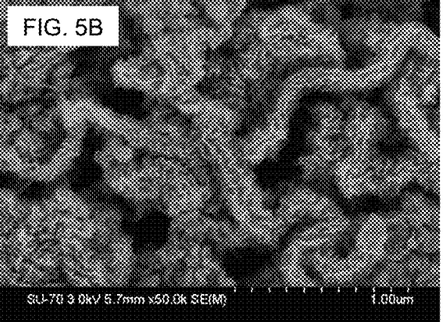
Figure 5C:
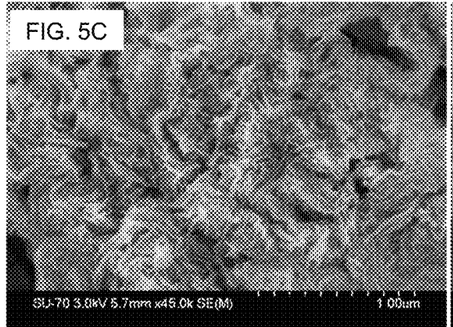
Figure 5D:
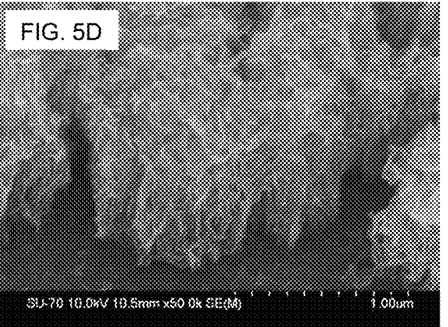
Figure 5E:
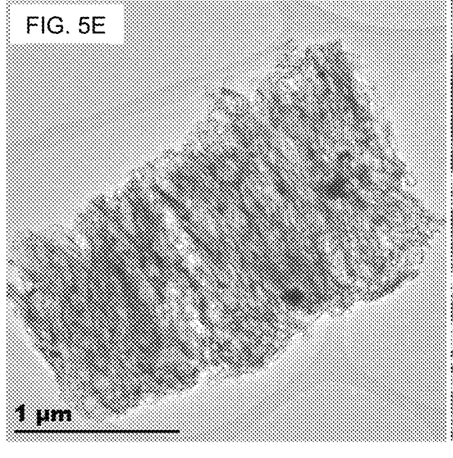
Figure 5F:
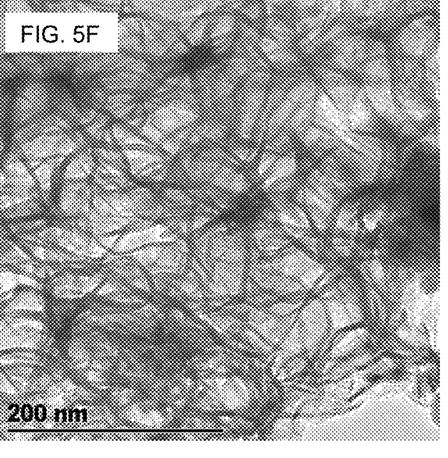

The typical steps in the formation of the active material from an Si or Ge nanowire electrode are shown in FIGS. 5A to 5D. These figures show the structural changes occurring in the electrode after 1, 10, 20 and 100 cycles. After 1 cycle (FIG. 5A), it can be seen that the nanowires maintain a relatively smooth surface, though some deformation of both the nanowire and the seed has occurred. After 10 cycles (FIG. 5B), the overall wire-like form of the active material is retained; however there has been a significant texturing of the surface of the nanowires through the formation of ridges and grooves. The deformation of the nanowires after 20 cycles (FIG. 5C) is much more severe, to the extent that the original nanowire form is all but lost. While the outline of some individual nanowires can just be made out, on the whole the composition of the active material has fundamentally changed as the original, individual nanowires have agglomerated and fused to form a network structure. Locally, the agglomeration of nanowires with their neighbours leads to the emergence of continuous porous island-like areas that form a network over the entire electrode. After 100 cycles, the electrochemical restructuring of the active material is complete, as all trace of the original nanowire morphology has been replaced by this network architecture, as can be seen from FIG. 5D. The composition of the active material after 100 cycles comprises of a series of interwoven ligaments. The convoluted nature of the network is apparent from FIG. 5F, which shows a mass of ligaments entangled with one another. The average ligament diameter is 5.6 nm±1.0 nm. Comparison of electrodes after 300 and 100 cycles show that the charge-discharge process has little effect on the morphology of this network once it has formed.

Figure 6A:
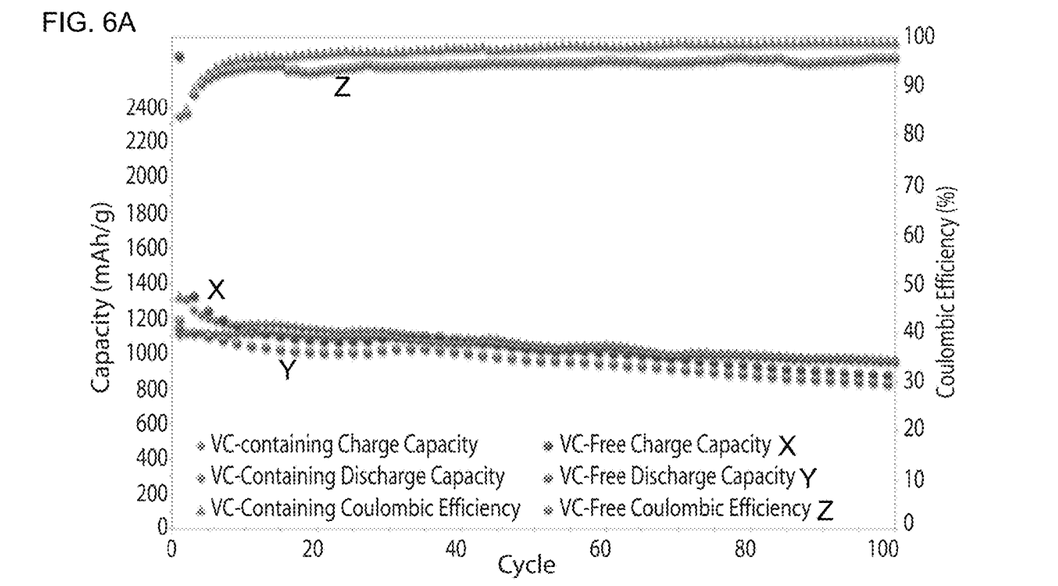
FIG. 6A shows a comparison of the electrochemical performance of the continuous porous network of Ge electrode of the present invention using a VC containing and a VC free 1M $LiPF_6$ EC/DMC electrolyte.
Figure 6B:
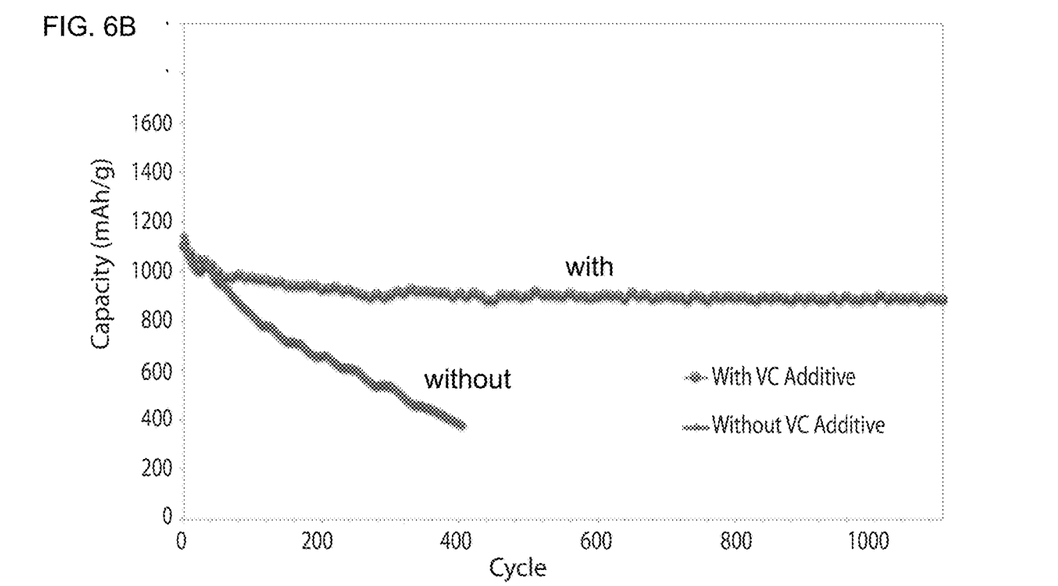
FIG. 6B shows a comparison of long-term capacity data using the VC containing electrolyte at C/2 rate with the VC free electrolyte cycled at a C rate.

As explained above, obtaining a stable anode architecture which can overcome the pulverisation problem is a prerequisite for a long cycle life. However the stability of the solid electrolyte interphase (SEI) layer and its contribution to the performance of the electrode is also of note, for the reasons given in the background to the invention section. In order to prevent such cracking, vinylene carbonate (VC), a stable SEI former can be added to the electrolyte in accordance with one embodiment of the invention. This prevents cracking, through forming a more durable, cohesive SEI. The direct effect of VC, and hence a more stable SEI layer, on the electrochemical performance of the continuous porous network of Ge electrode can be seen from FIG. 6, which compares the capacity data over 100 cycles of the electrodes in a VC containing (3 wt. %) and a VC free EC/DMC based electrolyte. The electrodes were charged and discharged at a C rate.

Figure 7:
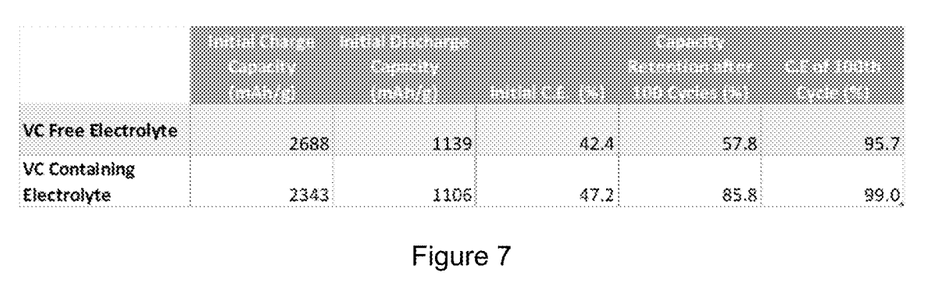
FIG. 7 shows a summary of the results from the galvanostatic cycling of the continuous porous network of Ge electrode of the present invention using two different electrolyte compositions, one without VC additive and one with 3 wt % VC additive.

The results, summarised in FIG. 7, show that the VC containing electrolyte boosts the performance of the material significantly. 85.8% of the initial discharge capacity is retained after 100 cycles using the VC additive compared to only 57.8% for the standard electrolyte. There is a considerable improvement in the C.E. also with the VC containing electrolyte exhibiting a C.E. of 99.0% after 100 cycles compared to 95.7% for its VC free equivalent.

It will be appreciated from the above analyses that the fabrication process of the continuous porous network of Si or Ge electrode and the use of this material as an anode in a Li-ion battery provide a number of advantages over other known anode fabrication techniques. When the porous interconnected network of Li-alloying active material of the present invention is used as an anode in a lithium-ion battery, it overcomes the problem of pulverisation encountered by bulk electrodes. This is due to the fact that the nanowires undergo a complete restructuring of their morphology to form the continuous porous network of Si or Ge or Sn ligaments, which is purposely formed in-situ in the battery through the charge/discharge process, with this network accommodating the mechanical stresses associated with the charge and discharge process without further deformation. Furthermore, the porous nature of the network can accommodate any volume changes occurring without a build-up of stress within the material. This network also remains well contacted to the current collector despite the restructuring process. As a result of this network, a battery using the Si or Ge nanowires anode of the present invention exhibits a very stable capacity over its lifetime and is mechanically robust. For example, a typical capacity is of 1200 mAh/g extending over 500 cycles for Si networks and 900 mAh/g extending over 1000 cycles for Ge networks. These electrodes exhibit comparable stability to graphitic based electrodes, while achieving much higher capacities. In addition, the short Li-ion diffusion distances due to the nano-dimensions of the material allows for superior rate capability over conventional electrodes.

Furthermore, when the network is used in conjunction with the electrolyte additive, vinylene carbonate, the SEI layer formed is more cohesive and flexible, thus eradicating the problem of continuous SEI build-up experienced by other Li-alloying nanowire electrodes.

The use of Sn in the fabrication of the electrode in place of gold seeds also offers advantages over and above the obvious cost savings. It resolves the problem of the detrimental effect that gold has on the performance of group IV nanowire electrodes. Also, the Sn seed has a high maximum theoretical capacity in its own right (994 mAh/g), and reversibly alloys with lithium during the charge/discharge process, contributing to the overall capacity of the electrode, unlike gold which is electrochemically inactive.

Furthermore, as a result of the vapour-liquid-solid growth mechanism, each nanowire is directly contacted to the current collector. This eliminates the need for binders and conductive additives, which cause the overall specific capacity of the anode to lower, due to the additives being electrochemically inactive.

As the electrode preparation process of the present invention does not use the traditional slurry coating process steps of mixing, coating, pressing and drying, the fabrication process of the present invention is more efficient. It is also more environmentally friendly than the slurry coating methods, as it eliminates the need for harsh solvents which are toxic, expensive, and generate flammable vapours during processing.

It will be appreciated therefore that the low energy processing method, reduced weight, extended cycle life and rate performance characteristics of anodes formed by the continuous porous network of a Si or Ge electrode makes these anodes suitable for the most demanding lithium-ion applications, such as long range battery electric vehicles. In addition, while the specification has focussed on the use of the continuous porous network of Si or Ge electrode of the invention in lithium-ion half cells, it should be noted that these nanowires are also suitable for use in a full cell in conjunction with commercially available cathode materials, such as for example $LiCoO_2$, $LiFePO_4$ and $LiMn_2O_4$.

In the specification the terms "comprise, comprises, comprised and comprising" or any variation thereof and the terms include, includes, included and including" or any variation thereof are considered to be totally interchangeable and they should all be afforded the widest possible interpretation and vice versa.

The invention is not limited to the embodiments hereinbefore described but may be varied in both construction and detail.

The invention claimed is:

1. A process for producing a lithium-ion battery comprising the steps of:
   providing an electrode structure comprising a substrate coated with an array of Si, Ge, or Sn nanowires;
   providing an electrode formulation comprising a component to stabilize a solid electrolyte interphase layer in contact with the electrode structure, wherein the component of the electrolyte formulation that stabilizes the solid electrolyte interphase layer comprises vinylene carbonate; and
   electrically cycling the Si or Ge or Sn electrode structure until a nanostructure forms of a continuous porous network of Si or Ge or Sn ligaments.

2. The process of claim 1, wherein the process further comprises continually lithiating and delithiating the Si or Ge or Sn electrode structure to form the continuous porous network of Si or Ge or Sn ligaments.

3. The process of claim 1, wherein the step of electrically cycling the Si or Ge or Sn electrode structure is performed for at least 100 cycles.

4. The process of claim 1, wherein the step of electrically cycling the Si or Ge or Sn electrode structure is performed at a rate of C/2.

5. A process for producing a lithium-ion battery comprising the steps of:
   providing an electrode structure comprising a substrate coated with an array of Si, Ge, or Sn nanowires;
   providing an electrode formulation comprising a component to stabilize a solid electrolyte interphase layer in contact with the electrode structure; and
   electrically cycling the Si or Ge or Sn electrode structure until a nanostructure forms of a continuous porous network of Si or Ge or Sn ligaments.

* * * * *